United States Patent
Kobayashi et al.

(10) Patent No.: US 8,017,197 B2
(45) Date of Patent: Sep. 13, 2011

(54) PLASMA PROCESSING METHOD AND PLASMA PROCESSING APPARATUS

(75) Inventors: Yasuo Kobayashi, Nirasaki (JP); Kohei Kawamura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1147 days.

(21) Appl. No.: 10/580,036

(22) PCT Filed: Nov. 19, 2004

(86) PCT No.: PCT/JP2004/017272
§ 371 (c)(1), (2), (4) Date: May 19, 2006

(87) PCT Pub. No.: WO2005/050726
PCT Pub. Date: Jun. 2, 2005

(65) Prior Publication Data
US 2007/0077737 A1    Apr. 5, 2007

(30) Foreign Application Priority Data
Nov. 19, 2003   (JP) ................. 2003-389691

(51) Int. Cl.
*H05H 1/24* (2006.01)
*C23C 14/02* (2006.01)
*C23C 16/00* (2006.01)
*C23F 1/00* (2006.01)

(52) U.S. Cl. ..... 427/569; 427/534; 427/577; 427/248.1; 427/249.1; 134/1.1; 156/345.1

(58) Field of Classification Search ................ 427/569, 427/534, 577, 249.1; 134/1.1; 156/345
See application file for complete search history.

(56) References Cited

U.S. PATENT DOCUMENTS

| | | | | |
|---|---|---|---|---|
| 5,417,826 A * | 5/1995 | Blalock | .......................... | 204/176 |
| 5,882,414 A * | 3/1999 | Fong et al. | ................. | 118/723 R |
| 6,162,499 A * | 12/2000 | Sandhu et al. | ................. | 438/579 |
| 6,228,751 B1 * | 5/2001 | Yamazaki et al. | ............. | 438/585 |
| 6,443,165 B1 * | 9/2002 | Akahori et al. | ................. | 134/1.1 |
| 2003/0178144 A1* | 9/2003 | Ohmi et al. | ............. | 156/345.41 |
| 2004/0077511 A1* | 4/2004 | Barnes et al. | ................. | 510/175 |

FOREIGN PATENT DOCUMENTS

| | | |
|---|---|---|
| JP | 07-335626 | 12/1995 |
| JP | 9-283510 | 10/1997 |
| JP | 10-144667 | 5/1998 |
| JP | 10-209137 | 8/1998 |

(Continued)

*Primary Examiner* — Timothy H Meeks
*Assistant Examiner* — Mandy C. Louie
(74) *Attorney, Agent, or Firm* — Oblon, Spivak, McClelland, Maier & Neustadt, L.L.P.

(57) ABSTRACT

A microwave is radiated into a processing chamber (1) from a planar antenna member of an antenna (7) through a dielectric plate (6). With this, a $C_5F_8$ gas supplied into the processing chamber (1) from a gas supply member (3) is changed (activated) into a plasma so as to form a fluorine-containing carbon film of a certain thickness on a semiconductor wafer (W). Each time a film forming process of forming a film on one wafer is carried out, a cleaning process and a pre-coating process are carried out. In the cleaning process, the inside of the processing chamber is cleaned with a plasma of an oxygen gas and a hydrogen gas. In the pre-coating process, the $C_5F_8$ gas is changed into a plasma, and a pre-coat film of fluorine-containing carbon thinner than the fluorine-containing carbon film formed in the film forming process is formed.

8 Claims, 5 Drawing Sheets

FOREIGN PATENT DOCUMENTS

| | | |
|---|---|---|
| JP | 11-162960 | 6/1999 |
| JP | 11-176820 | 7/1999 |
| JP | 2003-183839 | 7/2003 |
| JP | 2004-349458 | 12/2004 |
| WO | 02/080249 | 10/2002 |
| WO | WO 02/080249 A1 | 10/2002 |

* cited by examiner

(a) FILM FORMING

(b) CLEANING (c) PRE-COATING

FIG.5

PLASMA PROCESSING METHOD AND PLASMA PROCESSING APPARATUS

FIELD OF THE INVENTION

The present invention relates to a method and apparatus for forming a fluorine-containing carbon film, which is used as an interlayer insulating film of a semiconductor device for example, by using a plasma.

BACKGROUND OF THE INVENTION

There has been proposed a technology of wiring in a multi-layered structure as an approach for a high integration of a semiconductor device. In order to obtain the multi-layered wiring, an $n^{th}$ layer and an $(n+1)^{th}$ layer are connected to each other through a conductive layer while a thin film called as an interlayer insulating film is formed in areas other than the conductive layer. A $SiO_2$ film is widely used as a typical interlayer insulating film. To further accelerate the speed of an operation of the semiconductor device, it is required to lower the dielectric constant of the interlayer insulating film and to this end, much attention has been paid recently on a fluorine-containing carbon film (fluorocarbon film) which is a compound of carbon C and fluorine F. Whereas the relative dielectric constant of the $SiO_2$ film is about 4, that of the fluorine-containing carbon becomes, e.g., 2.5 or less by appropriately selecting a source gas so that it is very useful as the interlayer insulating film.

There is disclosed in Japanese Patent Laid-open Publication No. 10-44667 a technology of forming a fluorine-containing carbon film on a semiconductor wafer (hereinafter, referred to as "wafer") by using an electron cyclotron resonance ("ECR") plasma processing apparatus. Specifically, a microwave and a magnetic field interact with each other to cause ECR, so that a plasma generating gas such as Ar gas is converted into a plasma and a source gas such as $C_5F_8$ gas is then activated by the plasma to form the fluorine-containing carbon film on the wafer. In this technology, however, the fluorine-containing carbon film is deposited on the inner surface of a processing chamber and around a mounting table while the film forming process for the wafer is repeated, and the accumulation of the deposits grows to make it thick enough to be detached therefrom, thereby producing particles. Accordingly, after the film forming process is repeated a predetermined number of times (e.g., 12 times), the inside of the processing chamber is cleaned by using an oxygen plasma and the inner wall thereof is then coated with a thin precoat film of fluorine-containing carbon.

However, the fluorine-containing carbon film formed by using the ECR plasma processing apparatus has a high leakage current and is very brittle, so that adhesivity thereof is poor. To that end, it is impossible to obtain a fluorine-containing carbon film having a quality good enough to be used in an actual device with the ECR plasma processing apparatus.

Figure 5:
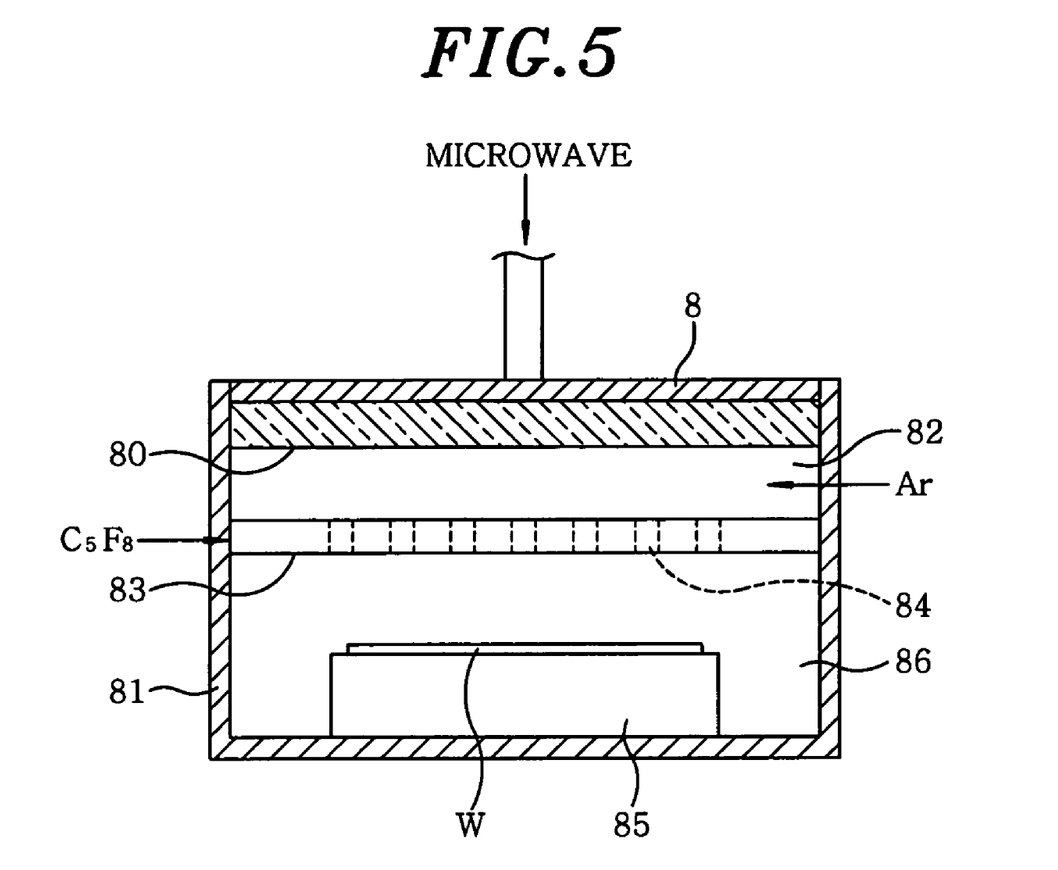
FIG. 5 is a schematic sectional view of a plasma processing apparatus for explaining an object of the present invention.

Accordingly, the inventors have researched and developed a plasma processing apparatus as shown in FIG. 5. The apparatus includes a processing chamber 81 in which a mounting table 85 is provided, and a disc-shaped planar antenna member 8 disposed at an upper portion of the processing chamber 81 to face the mounting table 85. The planar antenna member 8 has a plurality of slots circumferentially formed therein to emit a microwave therethrough. Disposed under the planar antenna member 8 is a dielectric plate 80 for transmitting the microwave radiated from the planar antenna member 8 therethrough. Further, a gas supply member (shower head) 83 made of aluminum is provided between the dielectric plate 80 and the mounting table 85. The gas supply member 83 divides the inside of the processing chamber 81 into an upper plasma generation space 82 and a lower processing space 86. Moreover, the gas supply member 83 has a plurality of through-holes 84 through which the spaces 82, 86 communicate with each other and a plurality of gas supply openings (not shown) opened in the bottom surface thereof.

In this apparatus, Ar gas introduced into the plasma generation space 82 is activated by the microwave radiated from the planar antenna member 8 through the dielectric plate 80. Further, $C_5F_8$ gas supplied through the gas supply openings in the shower head 83 flows into the plasma generation space 82 to diffuse therein and is activated by the Ar plasma. The active species of CF compound thus generated flow down into the processing space 86 through the through-holes 84 to be deposited onto the surface of the wafer W on the mounting table 85, thereby forming a fluorine-containing carbon film. Thus obtained fluorine-containing carbon film has a low leakage current and a good adhesivity.

It is conjectured that the improvement achieved in film quality as described above is realized because the plasma density is higher and the electron temperature is lower in the apparatus shown in FIG. 5 than in the ECR plasma processing apparatus. Meanwhile, if a fluorine-containing carbon film is attached to the bottom surface of the dielectric plate 80, a part of the microwave is absorbed by the fluorine-containing carbon film. Further, the nonuniform thickness of the fluorine-containing carbon film attached to the bottom surface of the dielectric plate 80 makes the transmittance of the microwave nonuniform, which deteriorates the uniformity of the generated plasma to adversely influence the film forming process on the wafer. The degree of the influence depends on the thickness of the film attached to the dielectric plate 80 and a target thickness of the film formed on the wafer. However, in view of making the interlayer insulating film thinner, the presence of the attached film itself becomes problematic. Furthermore, in case of processing a plurality of wafers sequentially, the thickness of the film attached to the bottom surface of the dielectric plate 80 gradually varies, thereby resulting in differences in thickness of the fluorine-containing carbon films formed on the surfaces of the respective wafers.

Further, in the apparatus shown in FIG. 5, as a material of the shower head 83, an aluminum member of great corrosion-resistance is used. On the surface of the shower head 83 made of aluminum, there occurs a bond of aluminum and fluorine by the plasma of the $C_5F_8$ gas which is a CF-based gas, thus forming a passivation film. However, if the surface of the shower head 83 is exposed to oxygen plasma during a cleaning process, the passivation film is decomposed to expose the aluminum. In addition, since the shower head 83 faces the planar antenna member 8 via the plasma generation space 82, it undergoes the sputtering action due to Ar ions while the film forming process is performed on the wafer. Accordingly, the wafer may be contaminated by the scattering of aluminum.

SUMMARY OF THE INVENTION

The present invention has been developed under the aforementioned background, and it is, therefore, an object of the present invention to provide a plasma processing method and apparatus capable of obtaining a fluorine-containing carbon film of a low dielectric constant and a low leakage current, and achieving a good thickness uniformity of the fluorine-containing carbon film among a plurality of substrates which are sequentially subjected to a film forming process.

In accordance with a first aspect of the present invention, there is provided a plasma processing method for forming a fluorine-containing carbon film on a surface of a substrate by using a plasma processing apparatus including a processing chamber in which a mounting table is provided; a disc-shaped planar antenna member disposed at an upper portion of the processing chamber to face the mounting table, a plurality of slots for radiating a microwave being circumferentially formed in the planar antenna member; a dielectric plate disposed under the planar antenna member, the dielectric plate transmitting the microwave radiated from the planar antenna member; and a conductive gas supply member disposed between the dielectric plate and the mounting table to divide the inside of the processing chamber into an upper plasma generation space and a lower processing space, the gas supply member having a plurality of through-holes and a plurality of gas supply openings, the plasma generation space and the processing space communicating with each other through the through-holes, wherein the method repeating at least two times the following steps of (a) to (e):

(a) mounting the substrate on the mounting table in the processing chamber;

(b) forming a fluorine-containing carbon film of a predetermined thickness on the surface of the substrate on the mounting table, which includes: (b1) supplying a rare gas into the plasma generation space, (b2) supplying a film forming gas, which is a compound gas containing carbon and fluorine, into the processing space through the gas supply openings of the gas supply member, and (b3) activating the rare gas and the film forming gas by radiating the microwave from the planar antenna member to deposit active species generated from the film forming gas;

(c) unloading the substrate on which the film is formed out of the processing chamber;

(d) after the step (c), by supplying a cleaning gas containing oxygen into the processing chamber and radiating the microwave from the planar antenna member to activate the cleaning gas, cleaning inner surfaces of the processing chamber including a bottom surface of the dielectric plate with oxygen active species generated from the cleaning gas; and (e) after the step (d), by supplying the film forming gas into the processing chamber and radiating the microwave from the planar antenna member to activate the film forming gas, forming a precoat film of fluorine-containing carbon thinner than the fluorine-containing carbon film formed in the step (b) on the inner surfaces of the processing chamber including the bottom surface of the dielectric plate with active species generated from the film forming gas.

In the step (b)-(b1), the rare gas may be supplied through the gas supply member or through a separate gas supply unit (e.g., a gas supply line communicating with the plasma generation space).

Further, in the step (e), the precoat film may be formed by sub-steps same as the sub-steps (b1) to (b3) in the step (b).

The steps (d) and (e) are preferably performed under the condition that a dummy substrate is mounted on the mounting table in the processing chamber.

For example, the gas supply member is made of aluminum or an aluminum alloy.

In this case, between the steps (d) and (e), there is preferably provided a step of, by supplying a gaseous mixture of an oxygen-containing gas and a rare gas into the processing chamber and radiating the microwave from the planar antenna member to activate the gaseous mixture, oxidizing the surface of the gas supply member with oxygen radicals generated from the gaseous mixture.

Alternatively, instead of the step (e), there may be provided a step of, by supplying a gaseous mixture of an oxygen-containing gas and a rare gas into the processing chamber and radiating the microwave from the planar antenna member to activate the gaseous mixture, oxidizing the surface of the gas supply member with oxygen radicals generated from the gaseous mixture.

In the latter case, the step (d) is preferably performed under the condition that a dummy substrate is mounted on the mounting table in the processing chamber.

In accordance with a second aspect of the present invention, there is provided a plasma processing apparatus for forming a fluorine-containing carbon film on a surface of a substrate by using a film forming gas which is a compound gas containing carbon and fluorine, the plasma processing apparatus comprising:

a processing chamber in which a mounting table is provided;

a transfer mechanism for transferring the substrate between the inside and the outside of the processing chamber;

a disc-shaped planar antenna member disposed at an upper portion of the processing chamber to face the mounting table, a plurality of slots for radiating a microwave being circumferentially formed in the planar antenna member;

a dielectric plate disposed under the planar antenna member, the dielectric plate transmitting the microwave radiated from the planar antenna member;

a conductive gas supply member disposed between the dielectric plate and the mounting table to divide the inside of the processing chamber into an upper plasma generation space and a lower processing space, the gas supply member having a plurality of through-holes and a plurality of gas supply openings, the plasma generation space and the processing space communicating with each other through the through-holes;

a gas supply line for supplying a cleaning gas containing oxygen into the processing chamber; and a controller for executing a control of repeating at least two times the following steps of (a) to (e):

(a) mounting the substrate on the mounting table in the processing chamber;

(b) forming a fluorine-containing carbon film of a predetermined thickness on the surface of the substrate on the mounting table, which includes: (b1) supplying a rare gas into the plasma generation space, (b2) supplying a film forming gas, which is a compound gas containing carbon and fluorine, into the processing space through the gas supply openings of the gas supply member, and (b3) activating the rare gas and the film forming gas by radiating the microwave from the planar antenna member to deposit active species generated from the film forming gas;

(c) unloading the substrate on which the film is formed out of the processing chamber;

(d) after the step (c), by supplying a cleaning gas containing oxygen into the processing chamber and radiating the microwave from the planar antenna member to activate the cleaning gas, cleaning inner surfaces of the processing chamber including a bottom surface of the dielectric plate with oxygen active species generated from the cleaning gas; and (e) after the step (d), by supplying the film forming gas into the processing chamber and radiating the microwave from the planar antenna member to activate the film forming gas, forming a precoat film of fluorine-containing carbon thinner than the fluorine-containing carbon film formed in the step (b) on the inner surfaces of the processing chamber including the bottom surface of the dielectric plate with active species generated from the film forming gas.

In accordance with the present invention, by using a plasma processing apparatus wherein a microwave is radiated from the planar antenna member facing the mounting table and the gas supply member made of a conductive material is provided between the planar antenna member and the mounting table, a plasma having a high density and a low electron temperature can be formed in the film forming process. Accordingly, a fluorine-containing carbon film of a low dielectric constant and a low leakage current can be obtained.

Furthermore, whenever the film forming process is performed on a single substrate, the inner surface of the processing chamber is cleaned by the oxygen active species. Therefore, the fluorine-containing carbon film attached to the bottom surface of the dielectric plate during the film forming process is always removed before the subsequent film forming process for the next substrate, thereby preventing the film forming process from being affected by the nonuniform thickness of the fluorine-containing carbon film attached to the bottom surface of the dielectric plate. Further, in case the pre-coating process is employed, the cleaning process and the pre-coating process are conducted whenever the film forming process is performed on a single substrate. Therefore, in case a number of substrates are sequentially subjected to the film forming process, the thickness of the precoat film formed on the inner surface of the processing chamber is uniform whenever a substrate is processed, thereby obtaining a good thickness uniformity for the fluorine-containing carbon film between the plural substrates which are sequentially subjected to the film forming process.

In addition, in case the gas supply member is made of aluminum or an aluminum alloy, the surface of the gas supply member exposed by the cleaning is protected by the precoat film. Moreover, a process for oxidizing the surface of the gas supply member is performed after the cleaning process to thereby form an oxide film having a high adhesivity on the surface of the gas supply member. Accordingly, it is possible to prevent the substrate from being contaminated by the scattering of the gas supply member's material.

DETAILED DESCRIPTION OF THE PREFERRED EMBODIMENTS

Hereinafter, a plasma film forming apparatus in accordance with a preferred embodiment of the present invention will be described with reference to FIGS. 1 to 3.

Figure 1:
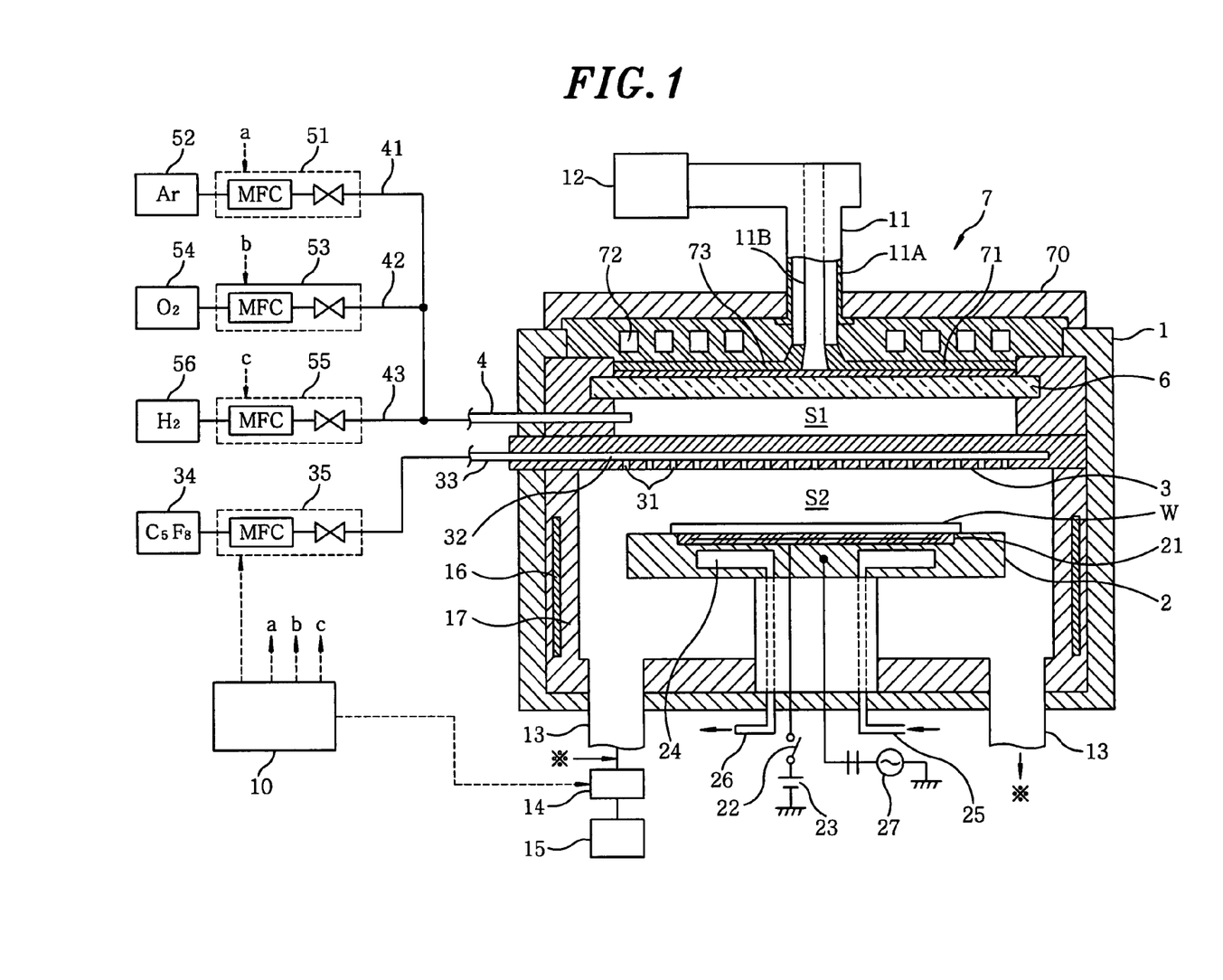
FIG. 1 shows a cross sectional view of a plasma processing apparatus in accordance with a preferred embodiment of the present invention.

Reference numeral 1 in FIG. 1 denotes a processing chamber made of, e.g., aluminum. In the processing chamber 1, there are provided a mounting table 2 made of, e.g., aluminum nitride or aluminum oxide for mounting thereon a substrate, i.e., a semiconductor wafer (hereinafter, referred to as "wafer"). The mounting table 2 includes at its top portion an electrostatic chuck 21 whose electrode is connected through a switch 22 to a DC power supply 23. Further, in the mounting table 2, there is provided a temperature control medium channel 24 which serves as a temperature control unit. A coolant introduced through an inlet path 25 flows through the channel 24 to be discharged through an outlet path 26. By using the coolant flowing through the channel 24 and a heater (not shown), the wafer W on the mounting table 2 is maintained at a predetermined temperature. Further, a bias radio frequency power supply 27 of, e.g., 13.56 MHz is connected to the mounting table 2.

Furthermore, above the mounting table 2, there is provided an approximately disc-shaped gas supply member (shower head) 3 made of, e.g., aluminum. The gas supply member 3 divides the inside of the processing chamber 1 into an upper plasma generation space S1 and a lower processing space S2. In the bottom surface of the gas supply member 3 facing the mounting table 2, there are formed a plurality of gas supply openings 31. Further, in the gas supply member 3, there are formed grid-patterned gas flow paths 32 (see FIG. 2) communicating with the gas supply openings 31. A gas supply line 33 is connected to the gas flow paths 32. A gas supply source 34 for supplying a film forming gas containing carbon and fluorine, e.g., $C_5F_8$ gas is connected to the gas supply line 33 through a gas supply kit 35. The $C_5F_8$ gas is supplied into the processing chamber 1 through the gas supply line 33, the gas flow paths 32 and the gas supply openings 31. The gas supply kit 35 includes a valve, a mass flow controller and the like.

Figure 2:
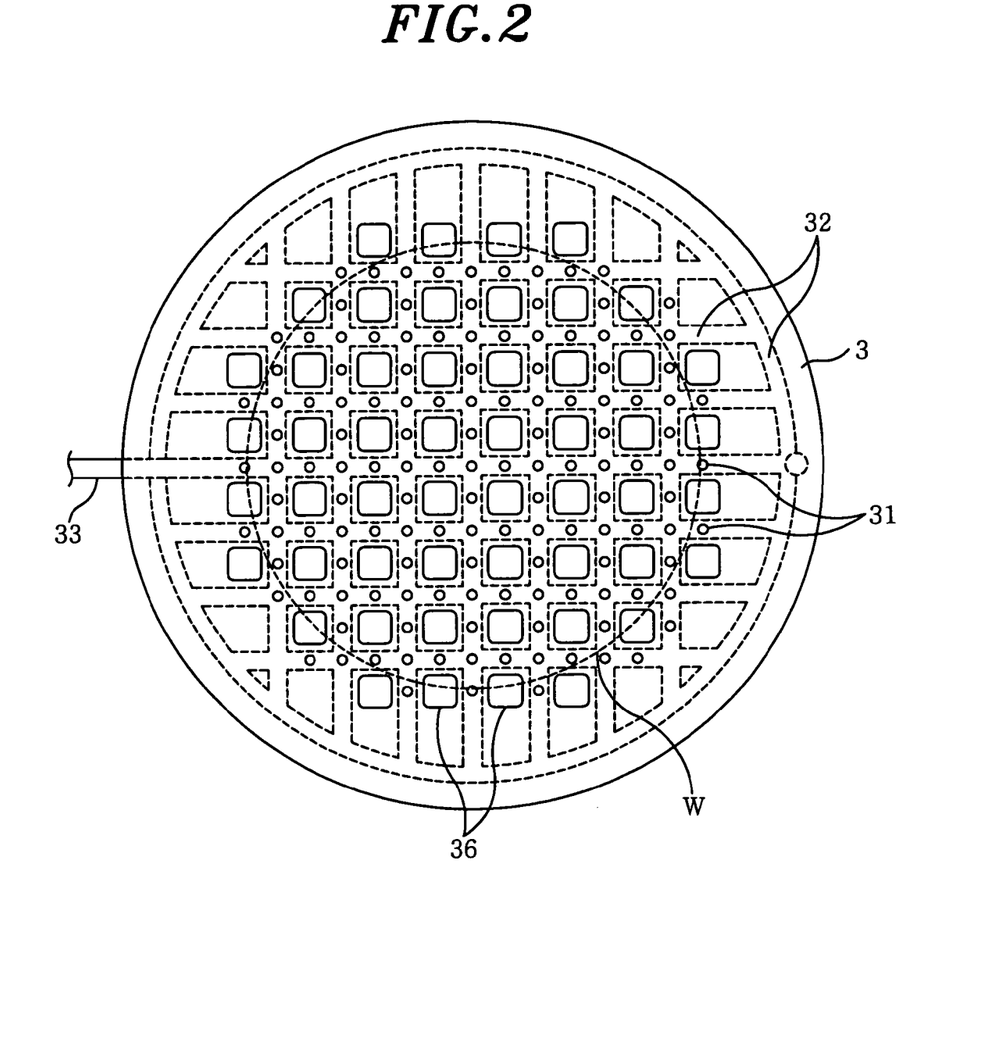
FIG. 2 depicts a bottom view of a gas supply member in the plasma processing apparatus shown in FIG. 1.

As shown in FIG. 2, a plurality of vertical through-holes 36 is formed in the gas supply member 3. The through-holes are for introducing the film forming gas supplied through the gas supply openings 31 into the plasma generation space S1 as well as drawing down active species generated from the film forming gas into the processing space S2. Each of the through-holes 36 is formed between the adjacent gas flow paths 32.

A gas supply line 4 is connected at its leading end to the processing chamber 1 to communicate with the inside of the plasma generation space S1. The gas supply line 4 is divided at an upstream side thereof into branch lines 41, 42 and 43. A gas supply kit 51 and a gas supply source 52 for a rare gas, e.g., Ar gas, are connected to the branch line 41. A gas supply kit 53 and a gas supply source 54 for $O_2$ gas are connected to the branch line 42. A gas supply kit 55 and a gas supply source 56 for $H_2$ gas are connected to the branch line 43. Each of the gas supply kits 51, 53 and 55 includes a valve, a mass flow controller and the like.

There is provided above the gas supply member 3 a dielectric plate (microwave transmission window) 6 made of, e.g., alumina $Al_2O_3$, quartz or the like, which is capable of transmitting a microwave therethrough. An antenna 7 is provided on the dielectric plate 6 having a close contact therewith. As shown in FIG. 3, the antenna 7 includes a disc-shaped antenna body 70 and a disc-shaped planar antenna member (slot plate) 71 disposed at the bottom surface of the antenna body 70. The antenna 70 and the planar antenna member 71 are both made of a conductive material, and a flat circular waveguide is formed between them. The antenna body 70 is divided into an upper and a lower member in the embodiment shown in FIG. 1. There is formed in the lower member a coolant channel 72 through which a coolant flows from an external coolant path. Further, there are schematically illustrated in FIG. 3 an inner structure of the antenna body 70 and a connection structure of the antenna 7 with a coaxial waveguide 11 to be described later.

Between the planar antenna member 71 and the antenna body 70, there is provided a phase delay plate 73 made of a low-loss dielectric material such as alumina, silicon oxide, silicon nitride and the like. The phase delay plate 73 serves to shorten the wavelength of the microwave to thereby shorten the wavelength in the circular waveguide. The antenna body 70, the planar antenna member 71 and the phase delay plate 73 form a radial line slot antenna ("RLSA") together.

The antenna 7 constructed as described above is installed via a seal member (not shown) to the processing chamber 1 such that the planar antenna member 71 is closely attached to the dielectric plate 6. The antenna 7 is connected through the coaxial waveguide 11 to a microwave generating unit 12 which supplies a microwave having a frequency of 2.45 GHz or 8.4 GHz. An outer waveguide 11A of the coaxial waveguide 11 is connected to the antenna body 70, and a central conductor 11B thereof extends through the phase delay plate 73 to be connected to the planar antenna member 71.

Figure 3:
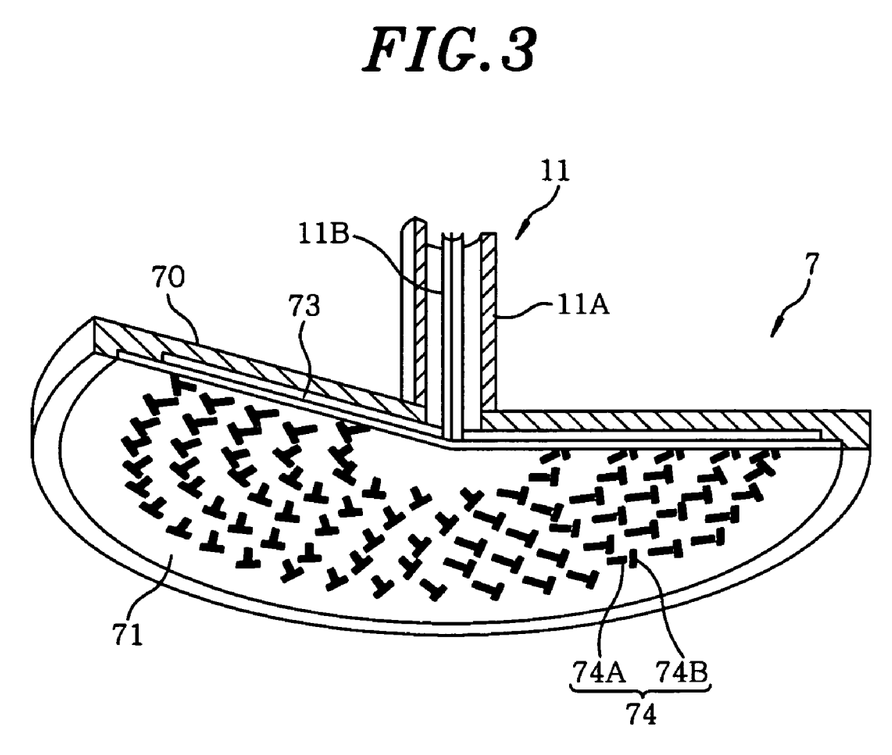
FIG. 3 sets forth a perspective view of an antenna portion in the plasma processing apparatus in FIG. 1, wherein a part thereof is shown in a sectional view.

The planar antenna member 71 is made of, e.g., a copper plate having a thickness of about 1 mm, and a plurality of slot portions 74 are formed therein as shown in FIG. 3. Each slot portion 74 has a pair of slots 74A, 74B formed in an approximate T-shape with a slight gap therebetween. The slot portions 74 are concentrically or spirally arranged along the circumference of the planar antenna member 71. In each slot portion 74, since the slots 74A, 74B are arranged substantially perpendicular to each other, circular polarization (circular polarized wave) including two perpendicular polarization components is radiated. By arranging each pair of slots 74A, 74B to have a gap corresponding to the wavelength of the microwave compressed by the phase delay plate 73, the microwave is radiated as a plane wave from the planar antenna member 71. Alternatively, in the slot portions 74, the pair of slots 74A, 74B may be disposed slightly apart from each other in an approximate V-shape.

As shown in FIG. 1, a gas exhaust line 13 is connected to the bottom of the processing chamber 1. The base side of the gas exhaust line 13 is connected through a pressure control unit 14 including a butterfly valve and the like to a vacuum pump 15. Further, attached to the inner wall of the processing chamber 1 is a sleeve 17 in which a heater 16 is embedded.

The plasma processing apparatus includes a controller 10 for controlling the gas supply kits 35, 51, 53 and 55, the pressure control unit 14 and the heater 16. The controller 10 also controls a transfer mechanism (not shown) for transferring the wafer W between the inside and the outside of the processing chamber 1. The controller 10 includes a storage unit storing recipes of the process conditions for a film forming process, a cleaning process and a pre-coating process, which will be described later, and a sequence program including information on a wafer transfer timing of the transfer mechanism and the like.

Hereinafter, there will be described a plasma processing method in accordance with a preferred embodiment of the present invention, which is performed by using the aforementioned plasma processing apparatus.

First, a wafer, on the surface of which a wiring is formed, is loaded through a gate valve (not shown) into the processing chamber 1 to be mounted on the mounting table 2. Subsequently, the inside of the processing chamber 1 is vacuum-exhausted to a predetermined pressure. Further, Ar gas as a plasma gas is supplied through the gas supply line 4 into the plasma generation space S1 at a predetermined flow rate, e.g., 300 sccm. Moreover, $C_5F_8$ gas as the film forming gas from the gas supply member 3 is supplied through the gas supply line 33 at a predetermined flow rate, e.g., 170 sccm. Then, the pressure in the processing chamber 1 is controlled to be maintained at a predetermined process pressure, e.g., 13.3 Pa (100 mTorr), and the surface temperature of the mounting table 2 is set to, e.g., 370° C.

In case a microwave of 2000 W and 2.45 GHz is supplied from the microwave generating unit 12, the microwave propagates through the coaxial waveguide 11 in TM mode, TE mode or TEM mode. The microwave having reached the antenna 7 propagates through the inner conductor 11B radially from the central portion of the planar antenna member 71 toward the peripheral portion thereof. While propagating radially through the planar antenna member 71, the microwave is radiated downwardly through the slots 74A, 74B thereof and the dielectric plate 6. The dielectric plate 6 is made of a material, such as alumina and the like, capable of transmitting the microwave therethrough, so that the radiated microwave is efficiently transmitted therethrough.

Due to the arrangement of the slots 74A, 74B (FIG. 3) as described above, the microwave is radiated as a circular polarization uniformly throughout the plane of the planar antenna member 71, so that the density of the electric field in the plasma generation space S1 thereunder becomes uniform. The Ar gas in the plasma generation space S1 is excited by the energy of the microwave to form a high density uniform Ar gas plasma. Meanwhile, $C_5F_8$ gas injected downwardly through the gas supply openings 31 of the gas supply member 3 is also introduced through the through-holes 36 into the upper plasma generation space S1 where the $C_5F_8$ gas is activated by contacting with the Ar gas plasma. The active species generated from the $C_5F_8$ gas move downwardly through the through-holes 36 into the lower processing space S2 under the gas supply member 3 to be deposited on the surface of the wafer W. In this way, an interlayer insulating film comprised of fluorine-containing carbon is formed to have a thickness of, e.g., 200 nm on the surface of the wafer W. In other words, with the plasma processing apparatus, since the processing space where the active species are dominantly present without any plasma emission is located under the plasma generation space S1 with the gas supply member 3 interposed therebetween, a fluorine-containing carbon film is formed by the so-called soft active species. Accordingly, it is possible to obtain a fluorine-containing carbon film of high density, great adhesivity and high thermal stability.

Figure 4:
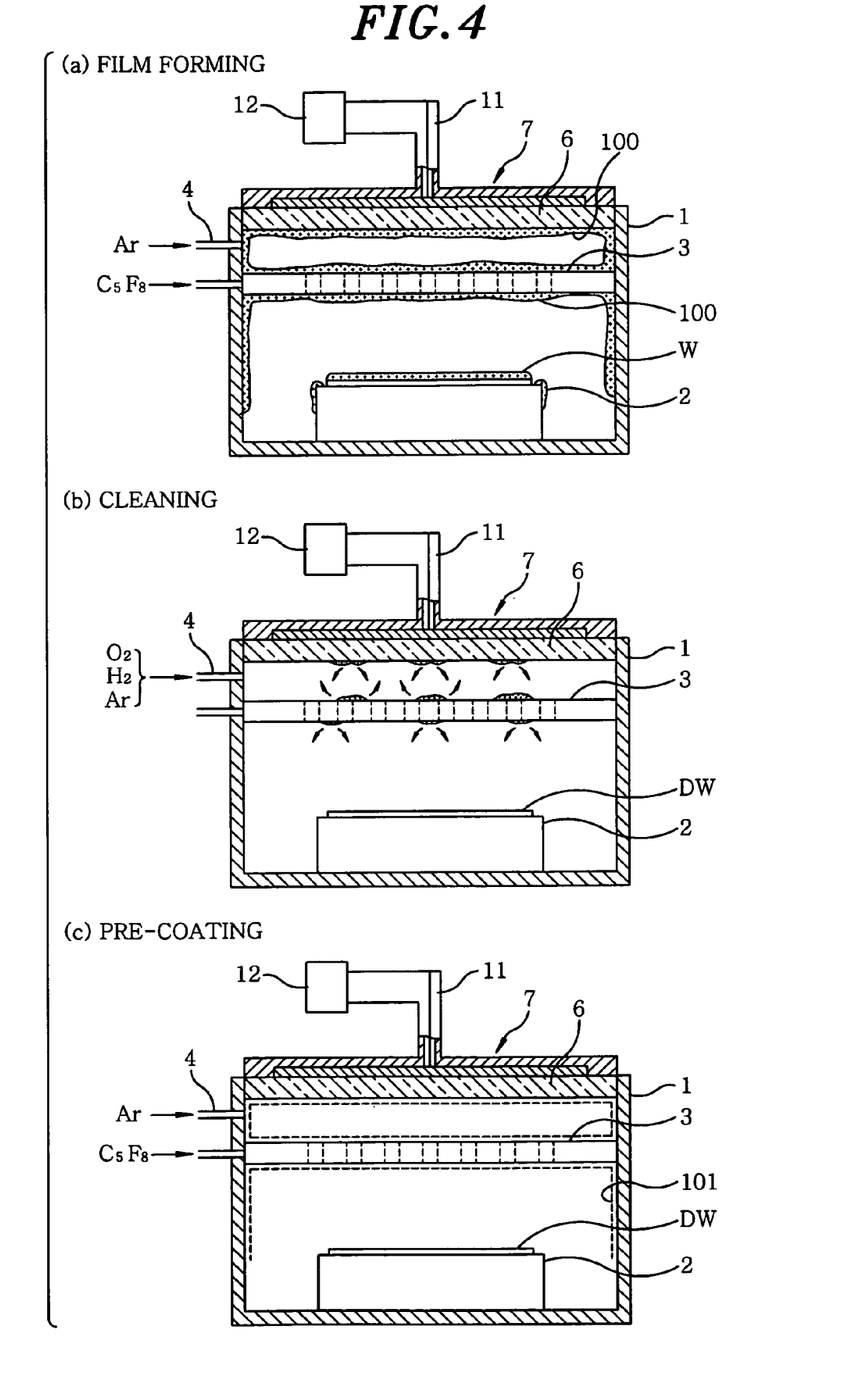
FIGS. 4A to 4C represent schematic sectional views sequentially showing a plasma processing method in accordance with the present invention.

In such a film forming process, as exaggeratively shown in FIG. 4A for the convenience of explanation, the fluorine-containing carbon film 100 is formed on the inner side of the processing chamber 1 as well as on the wafer W. The wafer w on which the fluorine-containing carbon film is formed is unloaded from the processing chamber 1 through the gate valve by the transfer mechanism.

After the wafer W is unloaded from the processing chamber 1, the cleaning process is performed successively. The cleaning process is for removing the fluorine-containing carbon film 100 attached to the bottom surface of the dielectric plate 6 and the like during the previous film forming process.

First, as shown in FIG. 4B, a dummy wafer DW is loaded in the processing chamber 1 to be mounted on the mounting table 2. This is for preventing the surface of the mounting table 2 from being etched by the cleaning process and for preventing a thin film formed on the mounting table 2 during the following pre-coating process from being attached to the bottom surface of a next wafer W to be processed. If it is determined that there would be no damage on the surface of the mounting table due to a cleaning gas and no attachment of the film to the bottom surface of the wafer W, these processes may be performed without mounting the dummy wafer DW on the mounting table 2.

Next, a cleaning gas including oxygen is supplied into the processing chamber 1. Specifically, the valves of the respective gas supply kits 51, 53 and 55 are opened and $O_2$ gas, $H_2$ gas and Ar gas are supplied through the gas supply line 4 into the processing chamber 1 at predetermined flow rates, e.g., 300 sccm, 300 sccm and 200 sccm, respectively. Simultaneously, the inside of the processing chamber 1 is maintained at a predetermined pressure, e.g., 13.3 Pa and the surface temperature of the mounting table 2 is set to 300° C. At this time, the temperature of the inner wall of the processing chamber 1 is about 170° C.

In the mean time, a microwave of 2.45 GHz, 2000 W is supplied from the microwave generating unit 12 to excite the plasma as described above. The $O_2$ gas and the $H_2$ gas supplied through the gas supply line 4 are activated by the plasma. By the activation of the $O_2$ gas, there are produced oxygen active species comprised of ions and/or radicals. The oxygen active species react with the fluorine-containing carbon film attached to the inner surface of the processing chamber 1, the bottom surface of the dielectric plate 6, the surface of the gas supply member 3 and the like. That is, the oxygen plasma breaks the bond between C and F in the fluorine-containing carbon film. Decomposed products of C and/or F generated thus are evaporated and scattered to be discharged through the gas exhaust line 13 to the outside of the processing chamber 1. Although fluorine radicals are produced at that time, they are converted into HF to be scattered by hydrogen radicals generated by the activation of $H_2$ gas, thereby suppressing the corrosion of the aluminum member. Further, a part of organic substances produced by the reaction of oxygen radicals with C of the fluorine-containing carbon film is decomposed by the hydrogen radicals.

In this way, the cleaning with the oxygen plasma and the hydrogen plasma is performed for, e.g., about 30 seconds to remove the fluorine-containing carbon film 100 attached to the dielectric plate 6 and/or the gas supply member 3.

Such cleaning process is not limited to the cleaning with the oxygen plasma and the hydrogen plasma, but may be performed by the cleaning with only the oxygen plasma. Further, after first performing the cleaning with the oxygen plasma, the cleaning with the hydrogen plasma may be performed. Still further, the gas supply member 3 may also be used as the gas supply line 4. That is, even when a rare gas such as Ar gas, $O_2$ gas and $H_2$ gas are supplied from the gas supply member 3, these gases diffuse into the upper plasma generation space S1 through the through-holes 36 (see FIG. 2), thereby obtaining the same effects.

After the completion of the cleaning process, the pre-coating process is performed wherein a thin precoat film 101 of fluorine-containing carbon is formed on the inner surface of the processing chamber 1, the bottom surface of the dielectric plate 6, the surface of the gas supply member 3 and the like, as shown in FIG. 4C. One purpose of the pre-coating process is to make the surface of the aluminum gas supply member 3 passive. This is because the cleaning with the oxygen plasma and the hydrogen plasma causes the aluminum of the surface of the gas supply member 3 to be exposed, which would result in a contamination by the scattering of the aluminum.

Meanwhile, in the cleaning process, when the oxygen plasma is irradiated on the fluorine-containing carbon film attached to the inside of the processing chamber 1, the fluorine-containing carbon film is carbonized to be removed whereas high molecular weight residual products such as C—C—C—O or CFO are attached to the wall surface of the processing chamber 1 and the shower head. During the subsequent film forming process for a next wafer W, these residual products may penetrate into the surface of the wafer W. Accordingly, it is another object of the pre-coating process to mask the residual products.

The processing conditions for the pre-coating process may be the same as those of the film forming process for forming the fluorine-containing carbon film on the wafer W. The precoat film may be thinner than the fluorine-containing carbon film formed in the film forming process, and the thickness thereof may be preferably 1 nm or greater, for example. The object of the previous cleaning process is to prevent a part of the microwave from being absorbed by the fluorine-containing carbon film attached to the bottom surface of the dielectric plate 6 so that the film forming process is prevented from being affected. From this viewpoint, it is preferable to make the precoat film as thinner as possible. Accordingly, the target thickness of the precoat film is preferably set to be, e.g., about 1 to 10 nm.

In accordance with the aforementioned embodiment, the microwave is radiated from the planar antenna member 71 facing the mounting table 2 to generate Ar gas plasma between the gas supply member 3 made of a conductive material and the dielectric plate 6 and produce so-called soft active species between the gas supply member 3 and the mounting table 2. In this way, it is possible to obtain a low electron temperature plasma with a high electron density of, e.g., about $5 \times 10^{11}$ numbers/cm$^3$. To that end, the bond between C and F of the $C_5F_8$ gas as the source gas is appropriately broken to obtain three-dimensional continuous chain structure, so that a fluorine-containing carbon film having a low dielectric constant and a low leakage current can be formed.

Actually, after forming a fluorine-containing carbon film of 200 nm thickness under the processing conditions as described above, the dielectric constant and the leakage current of the thin film were measured. The relative dielectric constant and the leakage current were measured to be 2.3 and $1 \times 10^{-8}$ (A/cm)/(1 MV/cm), respectively, which were acceptable. To the contrary, in case a fluorine-containing carbon film was formed by using the same source gas in the ECR plasma apparatus, the relative dielectric constant and the leakage current were measured to be 2.5 or greater and $1 \times 10^{-7}$ (A/cm)/(1 MV/cm)

Further, since the inside of the processing chamber 1 is cleaned by using the oxygen plasma (and the hydrogen plasma) whenever a wafer W undergoes the film forming process, the fluorine-containing carbon film attached to the dielectric plate 6 during the film forming process is always removed before the film forming process for the next wafer W. Accordingly, there is no microwave absorption caused by the fluorine-containing carbon film attached to the dielectric plate 6, so the film forming process is prevented from being affected.

In the subsequent pre-coating process, if the thickness of the precoat film formed in the processing chamber 1 is thin, in case the cleaning process and the pre-coating process are performed after about 12 wafers have been processed as in the conventional case, the deposition rate of the fluorine-containing carbon film formed on the surface of the initial wafer and that of the last wafer become significantly different from each other. This is because the rate of the fluorine-containing carbon film formed on the precoat film in the processing chamber 1 becomes getting lower as the precoat film becomes getting thicker. In this embodiment, the cleaning and the pre-coating process are performed whenever the film forming process is performed on a wafer W, so that all of the wafers W are processed under the same processing environment. In other words, since the precoat films attached to the inside of the processing chamber 1 have a same thickness, there can be realized a good thickness uniformity between the fluorine-containing carbon films formed on the wafers W.

Actually, after the cleaning process, the target thickness of the fluorine-containing carbon film formed on the wafer surface was set to be 300 nm, and the film forming process was successively performed on plural wafers W and the thickness of each wafer was then measured. The results indicated that the thicknesses of the fluorine-containing carbon films formed on the eighth wafer and wafers following thereafter became much smaller than the target thickness. This proves that the fluorine-containing carbon film attached to the dielectric plate 6 absorbs the microwave. Further, it is assumed that the absorption amount corresponds to the thickness of the fluorine-containing carbon attached to the dielectric plate 6. Particularly, as the interlayer insulating film formed on the wafer becomes thinner, it is certain that the fluorine-containing carbon film attached to the dielectric plate 6 affects the thickness uniformity in surface of the interlayer insulating film even though the thickness of the fluorine-containing carbon film is relatively small.

Meanwhile, in case about 10 or more wafers are to be successively subjected to the film forming process after the pre-coating process, the thickness of the precoat film should be set to be about 1000 nm or greater in order to make the thicknesses of films formed on the respective wafer surfaces uniform. When the precoat film of such thickness is formed, the influence of the microwave absorption becomes serious problem. Accordingly, in the plasma processing apparatus employing the RLSA, it is very effective to perform the cleaning and the pre-coating process whenever the film forming process is performed on a wafer W.

Further, aluminum fluoride is produced by the $C_5F_8$ gas plasma on the aluminum surface of the gas supply member 3 to make the surface passive. However, Al—Al in the Al—Al—F bond is cut by the oxygen plasma to expose the aluminum. Further, in case the cleaning is conducted with a plasma of a gaseous mixture of oxygen gas and hydrogen gas, F of Al—F is bonded to hydrogen to be scattered as hydrogen fluoride, so that the aluminum is also exposed. In such a state, if the film forming process is performed on the wafer, there is a likelihood that the aluminum is sputtered to penetrate into the fluorine-containing carbon film on the wafer. Accordingly, the pre-coating is conducted after the cleaning, so that the precoat film of fluorine-containing carbon is attached to the inner surface of the processing chamber 1 and the surface of the gas supply member 3, thereby suppressing the scattering of aluminum. Further, the material of the processing chamber 1 and/or the gas supply member 3 may not be limited to the aluminum, and an aluminum alloy is also effective as the material of them since it has a great corrosion-resistance.

Further, in the present invention, an oxidation process may be performed instead of or before the pre-coating process. The oxidation process is to oxidize the aluminum surface of the gas supply member 3 and/or the processing chamber 1 by using oxygen radicals and form an oxide film. Specifically, a rare gas plasma is used together with the oxygen radicals in the processing. That is, $O_2$ gas and Ar gas are supplied through the gas supply line 4 into the processing chamber 2 at flow rates of, e.g., 500 sccm and 100 sccm, respectively, while the pressure in the processing chamber 2 is kept at, e.g., 13.3 Pa. Further, a microwave of 2.45 GHz and 2000 W is introduced into the processing chamber 1 as described above, so that the $O_2$ gas and the Ar gas are activated to perform an oxidation process on the aluminum by using the generated oxygen radicals. At that time, a small amount of Ar penetrates into the oxide to suppress a film stress in the oxide film, so that a high adhesivity can be obtained. The rare gas is not limited to the Ar gas, and He gas, Ne gas, Kr gas, Xe gas and the like may be used as the rare gas.

The fluorine-containing carbon film formed in accordance with the present invention is not limited to the interlayer insulating film, but may be used as another insulating film. Furthermore, as the source gas, $CF_4$ gas, $C_2F_6$ gas, $C_3F_8$ gas, $C_3F_9$ gas and $C_4F_8$ gas may be used in lieu of the $C_5F_8$ gas.

While the invention has been shown and described with respect to the preferred embodiments, it will be understood by those skilled in the art that various changes and modifications may be made without departing from the spirit and scope of the invention as defined in the following claims.

What is claimed is:

1. A plasma processing method for forming a fluorine-containing carbon film on a surface of a substrate by using a plasma processing apparatus including a processing chamber in which a mounting table is provided; a disc-shaped planar antenna member disposed at an upper portion of the processing chamber to face the mounting table, a plurality of slots for radiating a microwave being circumferentially formed in the planar antenna member; a dielectric plate disposed under the planar antenna member, the dielectric plate transmitting the microwave radiated from the planar antenna member; and a conductive gas supply member disposed between the dielectric plate and the mounting table to divide the inside of the processing chamber into an upper plasma generation space and a lower processing space, the gas supply member made of aluminum or an aluminum alloy including an aluminum fluoride passivation film thereon and having a plurality of through-holes and a plurality of gas supply openings, the plasma generation space and the processing space communicating with each other through the through-holes, wherein the method comprises the steps of:

(a) mounting the substrate on the mounting table in the processing chamber;

(b) forming a fluorine-containing carbon film of a predetermined thickness on the surface of the substrate on the mounting table, including: (b1) supplying a rare gas into the plasma generation space, (b2) supplying a film forming gas, which is a compound gas containing carbon and fluorine, into the processing space through the gas supply openings of the gas supply member, and (b3) activating the rare gas and the film forming gas by radiating the microwave from the planar antenna member to deposit active species generated from the film forming gas;

(c) unloading the substrate on which the film is formed out of the processing chamber;

(d) after the step (c), by supplying a cleaning gas containing oxygen and hydrogen into the processing chamber and radiating the microwave from the planar antenna member to activate the cleaning gas, cleaning inner surfaces of the processing chamber including a bottom surface of the dielectric plate and the gas supply member with oxygen active species and hydrogen active species generated from the cleaning gas wherein during the cleaning at least a portion of the aluminum fluoride passivation film is removed from a surface of the gas supply member made of aluminum or aluminum alloy, thereby exposing a surface of the aluminum or aluminum alloy; and (e) after the step (d), by supplying a gaseous mixture of an oxygen-containing gas and a rare gas into the processing chamber and radiating the microwave from the planar antenna member to activate the gaseous mixture, oxidizing the exposed aluminum or aluminum alloy surface of the gas supply member with oxygen radicals generated from the gaseous mixture, wherein an oxide film having a high adhesivity is formed on the surface of the gas supply member by the oxidizing step (e).

2. The plasma processing method of claim 1, wherein the step (d) is performed under the condition that a dummy substrate is mounted on the mounting table in the processing chamber.

3. The plasma processing method of claim 1, further comprising the step of:
(f) repeating the steps of (a), (b), (c), (d) and (e) in that order.

4. The plasma processing method of claim 1, further comprising the step of:
(f) after the step (e), by supplying the film forming gas into the processing chamber and radiating the microwave from the planar antenna member to activate the film forming gas, forming a precoat film of fluorine-containing carbon on the inner surfaces of the processing chamber including the bottom surface of the dielectric plate with active species generated from the film forming gas.

5. The plasma processing method of claim 4, further comprising the step of:
(g) repeating the steps (a) to (f) in that order.

6. The plasma processing method of claim 5, wherein the thickness of the precoat film formed by the step (e) before repetition is substantially identical to a thickness of the precoat film formed by the step (e) after repetition.

7. The plasma processing method of claim 4, wherein, wherein the steps (d) and (f) are performed under the condition that a dummy substrate is mounted on the mounting table in the processing chamber.

8. The plasma processing method of claim 1, wherein, when the step (e) is performed, the rare gas penetrates into the oxide film to suppress a film stress in the oxide film.

* * * * *